(12) United States Patent
Hilgendorf et al.

(10) Patent No.: US 7,376,875 B2
(45) Date of Patent: May 20, 2008

(54) METHOD OF IMPROVING LOGICAL BUILT-IN SELF TEST (LBIST) AC FAULT ISOLATIONS

(75) Inventors: Rolf Hilgendorf, Austin, TX (US); Johannes Koesters, Weil Im Schoenbuch (DE); Thomas Pflueger, Leinfelden (DE)

(73) Assignee: International Business Machines Corporation, Armonk, NY (US)

( * ) Notice: Subject to any disclaimer, the term of this patent is extended or adjusted under 35 U.S.C. 154(b) by 93 days.

(21) Appl. No.: 11/181,406

(22) Filed: Jul. 14, 2005

(65) Prior Publication Data
US 2007/0033468 A1    Feb. 8, 2007

(51) Int. Cl.
*G01R 31/28*    (2006.01)

(52) U.S. Cl. .................. 714/734; 714/25; 714/30; 714/726; 714/727; 714/729; 714/732; 714/733; 714/736

(58) Field of Classification Search ............ None
See application file for complete search history.

(56) References Cited

U.S. PATENT DOCUMENTS

| | | | |
|---|---|---|---|
| 6,125,465 A * | 9/2000 | McNamara et al. ........ 714/733 |
| 6,393,594 B1 * | 5/2002 | Anderson et al. ........... 714/738 |
| 6,557,129 B1 * | 4/2003 | Rajski et al. ............... 714/729 |
| 6,715,105 B1 * | 3/2004 | Rearick ...................... 714/30 |
| 6,829,740 B2 * | 12/2004 | Rajski et al. ............... 714/729 |
| 6,901,546 B2 * | 5/2005 | Chu et al. ................... 714/738 |
| 6,993,694 B1 * | 1/2006 | Kapur et al. ............... 714/733 |
| 7,032,148 B2 * | 4/2006 | Wang et al. ................ 714/729 |
| 7,058,869 B2 * | 6/2006 | Abdel-Hafez et al. ...... 714/729 |
| 2005/0240848 A1 * | 10/2005 | Cote et al. .................. 714/726 |
| 2006/0095818 A1 * | 5/2006 | Bratt et al. ................. 714/726 |
| 2006/0200719 A1 * | 9/2006 | Keller ......................... 714/732 |

\* cited by examiner

*Primary Examiner*—John P Trimmings
(74) *Attorney, Agent, or Firm*—Volel Emile; Robert M. Carwell; D'Ann N. Rifai (57) ABSTRACT

A system, apparatus and method of isolating a plurality of limiting logical cones in a chip during a logical built-in self test (LBIST) are provided. An LBIST is performed on the chip in order to locate a first latch that fails the test. Particularly, latches on the chip are arranged in a plurality of scan chains wherein each latch holds data for a logical cone. The LBIST is performed on one scan chain at a time. Once the first latch is located, a first limiting cone (i.e., the cone for which the first latch is holding data) may be isolated. After isolating the first limiting cone, the data from the first latch is masked out and the LBIST is repeated on the scan chain. The data is masked out in order to facilitate the identification of any other latch that may fail the test. Again, if another latch fails the test a corresponding limiting cone may be isolated.

4 Claims, 6 Drawing Sheets

METHOD OF IMPROVING LOGICAL BUILT-IN SELF TEST (LBIST) AC FAULT ISOLATIONS

BACKGROUND OF THE INVENTION

1. Technical Field

The present invention is directed to built-in self-tests (BISTs). More specifically, the present invention is directed to a system, apparatus and method of improving logical built-in self test (LBIST) AC fault isolations.

2. Description of Related Art

LBIST technology has been used for decades to detect and isolate faults in integrated chips. An LBIST circuitry (see FIG. 1(a)) generally consists of a pseudo-random pattern generator (PRPG) 102, a plurality of parallel scan chains of latches 106 of the circuitry under test and a multiple input signature register (MISR) 110. A scan chain is also known in the field as a STUMP which is short for Self-Test Using MISR and Parallel shift register sequence generator. Scan chain and STUMP will be used interchangeably throughout the remainder of the disclosure.

Figure 1A:
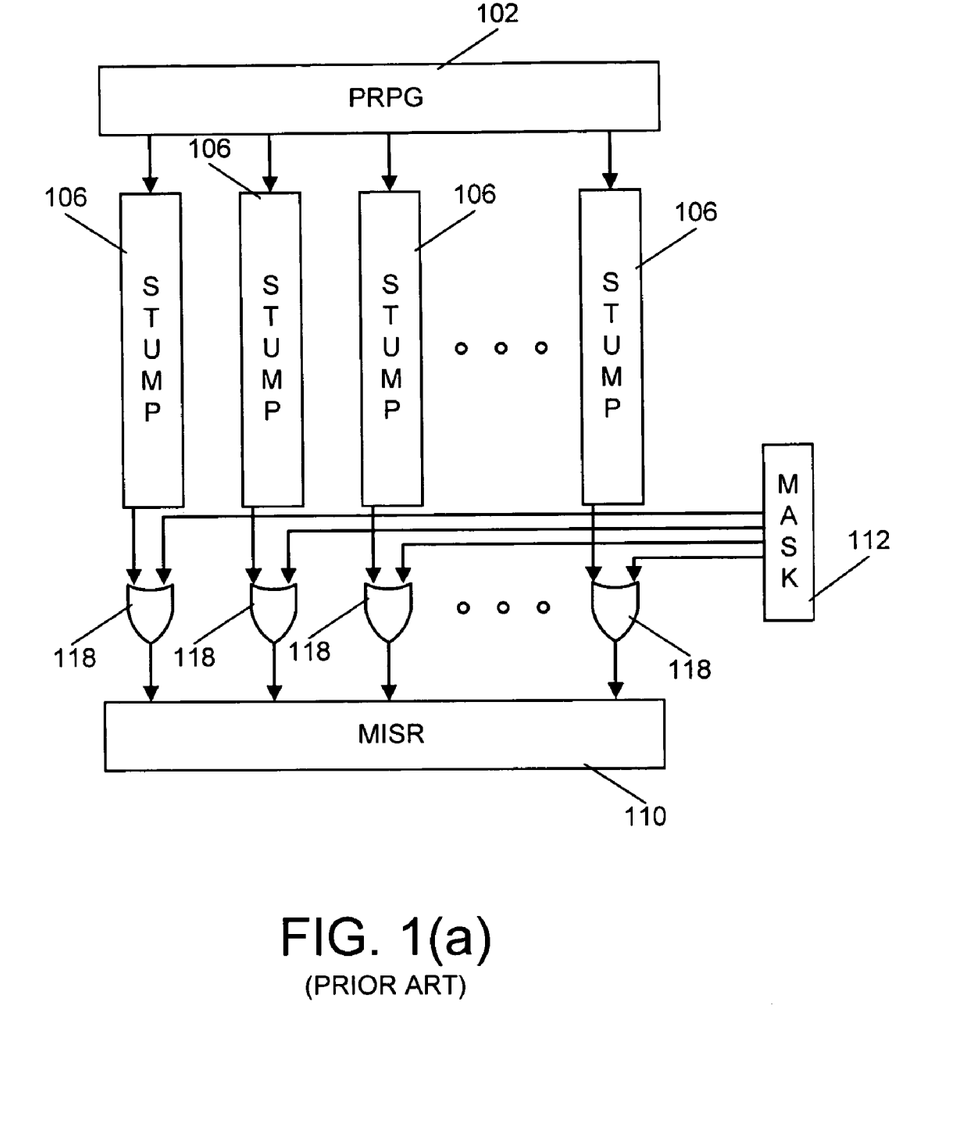
FIG. 1(a) depicts a prior art logical built-in self test (LBIST) circuitry.

The PRPG 102 generates a pseudo-random pattern of data (i.e., test data) that is fed into the parallel STUMPS 106 at each scan clock cycle. Further, at each scan clock cycle, test data in a preceding latch is shifted down to a succeeding latch in each one of the scan chains 106. This procedure continues until all the latches in the circuit are loaded with test data. Thus, the number of scan clock cycles is equal to at least the number of latches in the longest scan chain in the circuit. This part of the LBIST is generally referred to as the scan-shift phase. Once all the latches are loaded with test data, one or more (usually as many as desired) functional clocks are applied to the circuit.

As is well known, the latches are used to hold data that comes from combinational logic elements and/or is to be used as input to the combinational logic elements in the circuit. For example, at the application of a first functional clock of an LBIST, test data from a latch may be used as input to a combinational logic element and at the next functional clock, the latch may be used to hold data from a combinational logic element (e.g., the result of a test). Thus, the functional clocks are used to provide test data to the combinational logic elements in the circuit and to capture data from the combinational logic elements in the circuit into the latches of the STUMPS 106. This part of the LBIST is referred to as the data capture phase.

A scan-shift phase and a data capture phase make up an LBIST cycle. During the scan-shift phase of each succeeding LBIST cycle, the result of the test from the preceding LBIST cycle is scanned out of the STUMPS 106 and inputted into the MISR 110.

The LBIST circuitry may be used for DC and/or AC fault detection and isolation. DC fault detection entails determining whether the circuit being tested has at least a DC stuck-at or "broken" chain while AC fault detection includes determining whether the circuit has an AC defect. A circuit that has an AC defect contains at least one cone of influence. A cone is a combinational logic in a circuit that resolves into a single point. A cone of influence is a cone that does not exhibit errors at one clock rate (e.g., a slower clock rate) but does exhibit errors at another clock rate (e.g., a faster clock rate).

In DC fault detection, the MISR 110 compresses the data from the STUMPS 106 from one or several LBIST cycles into a unique signature of the logic circuit under test. A correct signature (i.e., the signature that should be obtained in the absence of a fault), which would have previously been obtained through analyses of the circuit under test may be compared with the unique signature to determine whether there is a DC fault. If the two signatures are the same, the circuit does not have a DC fault; otherwise, it does.

Provided that the circuit does not have a DC fault, it may further be tested for AC faults. In an AC fault detection test, the circuit is first evaluated under a relaxed time to obtain a reference signature. A relaxed time is a time that is long enough to allow all logic cones to fully evaluate. The reference signature is generally obtained under DC conditions. Once the reference signature is obtained, the test is run multiple times, each time using a faster LBIST cycle (i.e., faster functional clock rates), until a signature from the MISR 110 differs from the reference signature. Once this occurs, the maximum frequency of the circuit may be obtained. The maximum frequency of the circuit is the fastest frequency (i.e., the highest functional clock rate during the data capture phase) immediately before the frequency at which the signature from the MISR 110 differs from the reference signature.

In addition to finding the maximum frequency of the circuit, cones of influence or limiting cones may be determined. Determining a limiting cone may be of importance if the circuit is to be improved as well as if timing evaluations using different models are to be cross-checked. To determine which one of the cones in the circuit is a limiting cone, each STUMP 106 that contains a limiting cone has to be first isolated. To do so, mask controller 112 is used.

The mask controller 112 uses a plurality of OR gates 118 to mask all but one of the outputs of STUMPS 106. That is, the mask controller 112 outputs a logical one (1) or high bit to all but one of the OR gates 118. Then, the LBIST cycle for which the signature for the AC evaluation differs from the reference signature is determined for that unmasked STUMP 106 by running the AC fault detection test once more. If no signature change is registered then the unmasked STUMP 106 does not contain a limiting cone. If, on the other hand, a signature change is registered the unmasked STUMP 106 does contain a limiting cone.

Each STUMP 106 will sequentially be unmasked while all the others are masked. The AC fault detection test will be performed for each STUMP 106 unmasked. All unmasked STUMPS 106 for which a signature change is registered may be tagged as having at least one limiting cone.

To isolate a limiting cone in a STUMP 106, a dump of the latches in a STUMP 106 that is tagged as having a limiting cone may be performed under DC conditions as well as under AC conditions. The two dumps must be performed at the same LBIST cycle, the cycle at which the signature difference is registered, and compared to each other. The comparison will generally reveal the failing latch; and thus, the limiting cone.

This procedure, however, only allows one limiting cone to be isolated in any particular STUMP. Clearly, one STUMP may contain more than one limiting cone.

Thus, what is needed is a system, apparatus and method of improving AC fault isolations such that more than one limiting cone may be isolated in a STUMP.

SUMMARY OF THE INVENTION

The present invention provides a system, apparatus and method of improving logical built-in self test (LBIST) by allowing for the isolation of a plurality of limiting logical cones in a chip during a logical built-in self test (LBIST). The chip contains a plurality of latches for holding data for a plurality of logical cones. For the LBIST, the latches are arranged in a plurality of scan chains. The LBIST is performed on one scan chain at a time to determine whether or not a first latch fails the LBIST. If a first latch fails the LBIST, the first latch is identified in order to isolate a first limiting cone (i.e., the cone for which the first latch is holding data).

After isolating the first limiting cone, the data from the first latch may be masked out before and the LBIST may be continued. The data is masked so that any other latch that may fail the test may be identified. Again, the latch is identified so that a second limiting cone may be isolated.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

DETAILED DESCRIPTION OF THE PREFERRED EMBODIMENT

Figure 2:
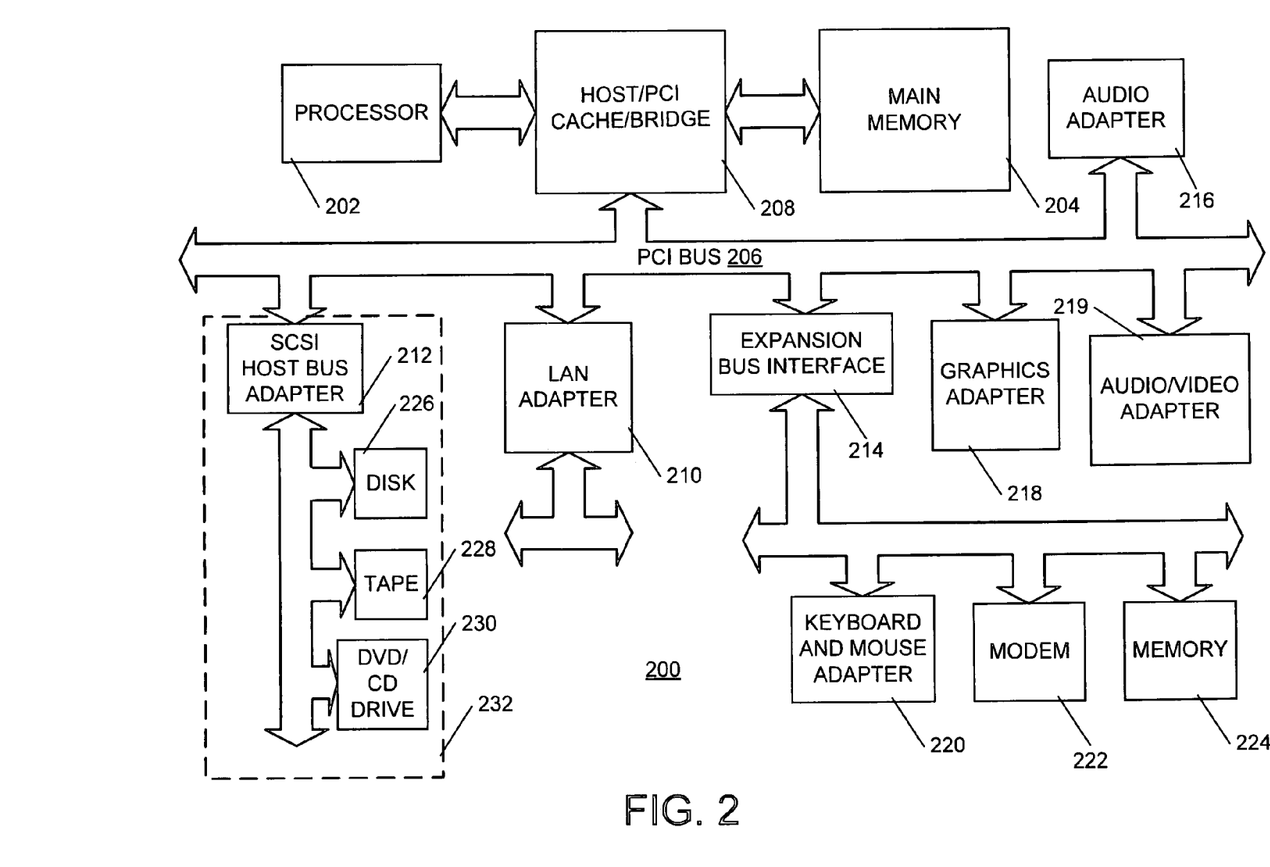
FIG. 2 is an exemplary block diagram of a client apparatus according to the present invention.

Turning to the figures, wherein like numbers denote like parts throughout, FIG. 2 depicts a block diagram of a data processing system in which the present invention may be implemented. Data processing system 200 employs a peripheral component interconnect (PCI) local bus architecture. Although the depicted example employs a PCI bus, other bus architectures such as Accelerated Graphics Port (AGP) and Industry Standard Architecture (ISA) may be used. Processor 202 and main memory 204 are connected to PCI local bus 206 through PCI bridge 208. PCI bridge 208 also may include an integrated memory controller and cache memory for processor 202. Additional connections to PCI local bus 206 may be made through direct component interconnection or through add-in boards. In the depicted example, local area network (LAN) adapter 210, SCSI host bus adapter 212, and expansion bus interface 214 are connected to PCI local bus 206 by direct component connection. In contrast, audio adapter 216, graphics adapter 218, and audio/video adapter 219 are connected to PCI local bus 206 by add-in boards inserted into expansion slots. Expansion bus interface 214 provides a connection for a keyboard and mouse adapter 220, modem 222, and additional memory 224. Small computer system interface (SCSI) host bus adapter 212 provides a connection for hard disk drive 226, tape drive 228, and CD-ROM/DVD drive 230. Typical PCI local bus implementations will support three or four PCI expansion slots or add-in connectors.

An operating system runs on processor 202 and is used to coordinate and provide control of various components within data processing system 200 in FIG. 2. The operating system may be a commercially available operating system, such as Windows XP™, which is available from Microsoft Corporation or AIX, available from International Business Machines of Armonk New York. An object oriented programming system such as Java may run in conjunction with the operating system and provide calls to the operating system from Java programs or applications executing on data processing system 200. "Java" is a trademark of Sun Microsystems, Inc.

Those of ordinary skill in the art will appreciate that the hardware in FIG. 2 may vary depending on the implementation. Other internal hardware or peripheral devices, such as flash ROM (or equivalent nonvolatile memory) or optical disk drives and the like, may be used in addition to or in place of the hardware depicted in FIG. 2. Also, the processes of the present invention may be applied to a multiprocessor data processing system.

The depicted example in FIG. 2 is not meant to imply architectural limitations. For example, data processing system 200 may also be a notebook computer, a server or a hand-held computer. Data processing system 200 also may be a kiosk or a Web appliance.

Figure 3:
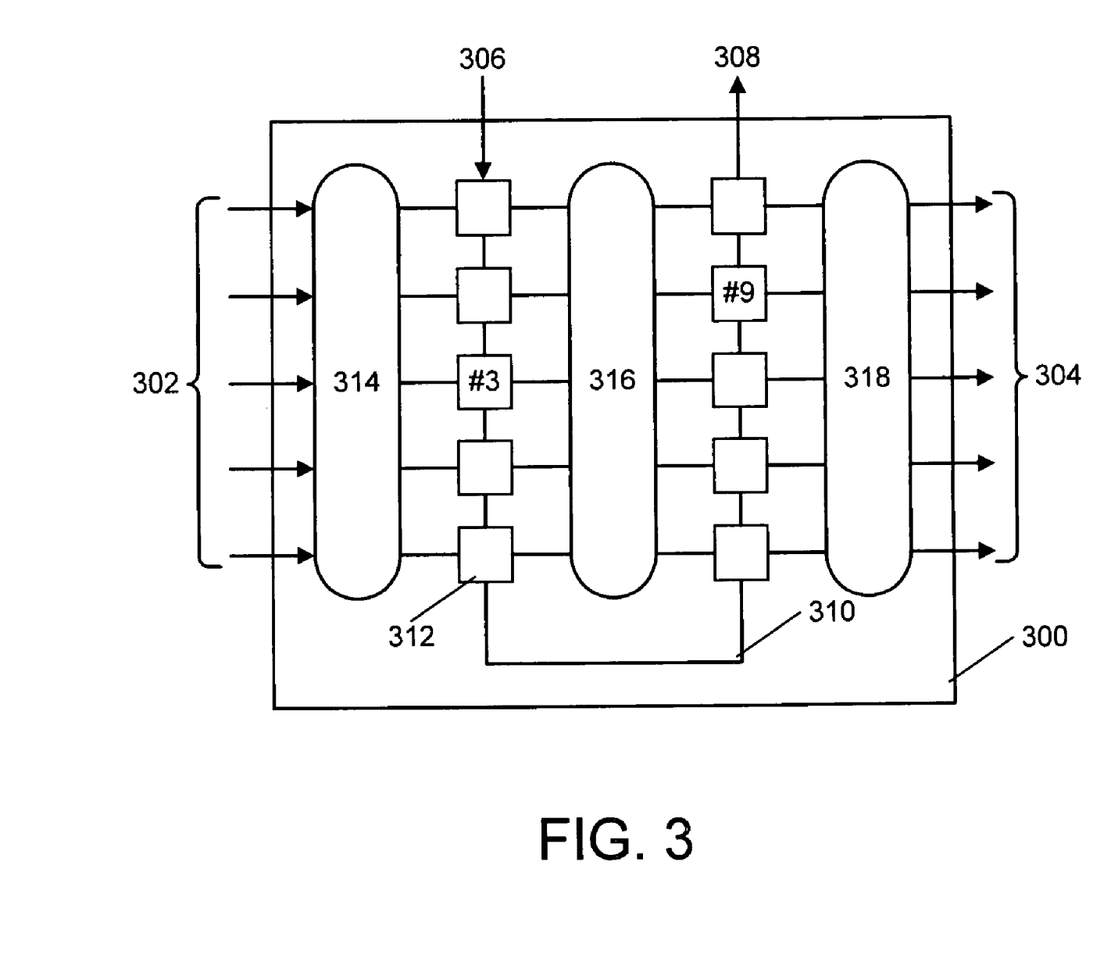
FIG. 3 depicts an integrated chip (IC) on which the invention may be implemented.

FIG. 3 depicts an integrated chip (IC) 300 on which the invention may be implemented. An IC, as is well known in the art, is a small piece of semi-conducting material (e.g., silicon) on which an integrated circuit is embedded. The IC 300 may be a microprocessor chip, a memory chip or a system-on-chip (SOC). In this particular example, however, the IC 300 is a memory chip. But note that the invention is not thus restricted. Any other type of chips (e.g., microprocessor chip, SOC etc.) is well within the scope of the invention. Thus, disclosing the IC 300 as a memory chip is for illustrative purposes only.

Returning to FIG. 2, system memory 204 may be regarded as IC 300. In any event, the IC 300 includes a plurality of combinational logic blocks (i.e., combinational logic blocks 314, 316 and 318) and a plurality of latches 312. The combinational logic blocks 314, 316 and 318, as their names suggest, may include combinational logic such as AND gates, OR gates etc.

The latches 312 are arranged in a manner that allows a system test engineer, for example, to test the combinational logic blocks 314, 316 and 318 (see scan latch chain 310) as well as to allow the chip to store data during its regular operation.

During regular operation, the processor 202 (see FIG. 2) may load data into the IC 300 through parallel inputs 302 and may retrieve data from the IC 300 through parallel outputs 304. During testing, however, the processor may load test data to the IC 300 through serial input 306. The test data may exit the IC 300 through serial output 308.

The system test engineer may test the latches 312 of the IC 300 independently of or in conjunction with combinational logic blocks 314, 316 and 318. When the latches are tested in conjunction with combinational logic blocks 314, 316 and 318, the latches 312 are used to hold input data to and/or output data from the combinational logic blocks 314, 316 and 318.

Figure 4:
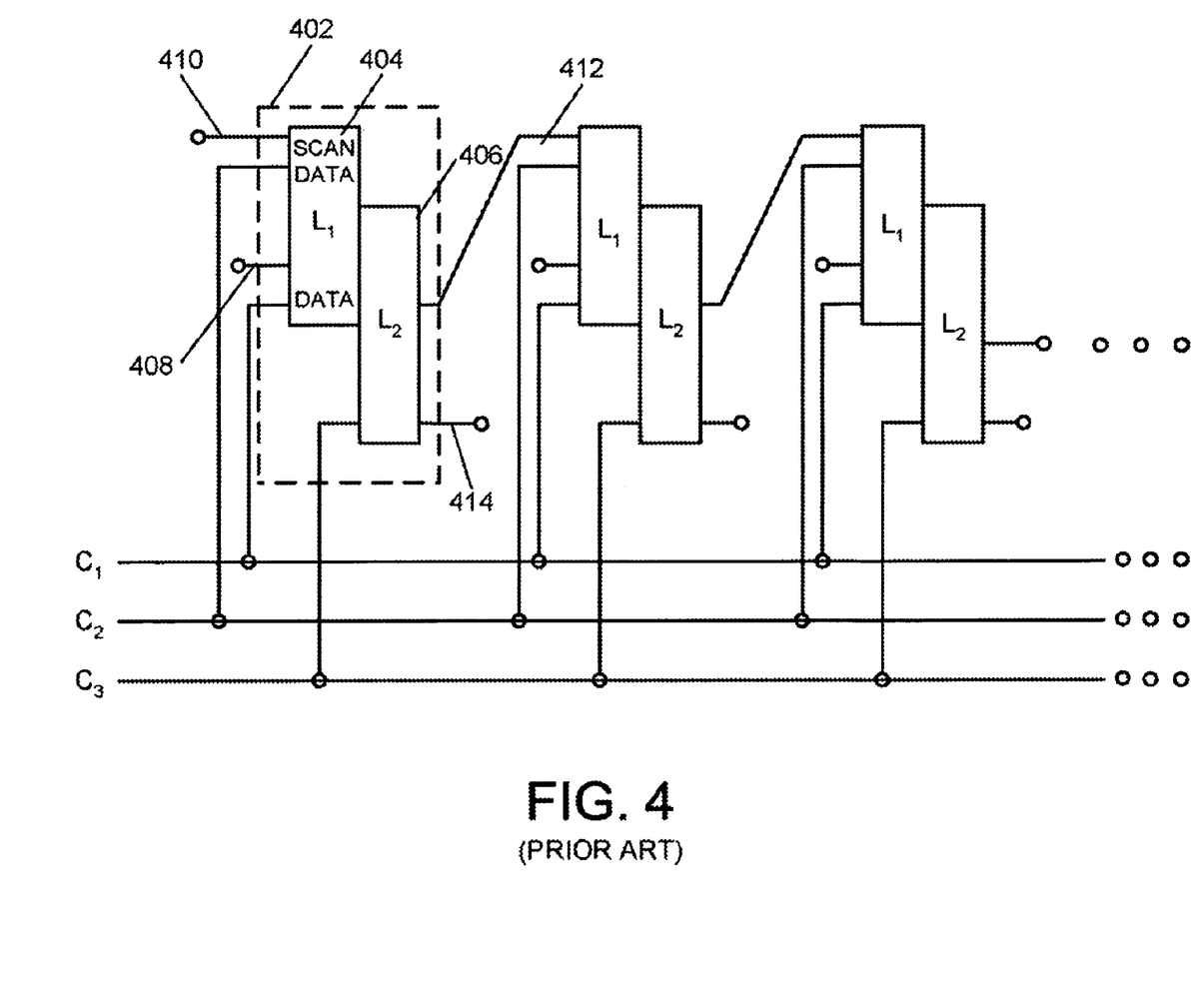
FIG. 4 shows a detailed view of a scan chain latch circuit.

FIG. 4 shows a detailed view of a scan chain latch circuit. The scan chain latch circuit includes a plurality of shift register latches 402 arranged serially. Each shift register latch 402 includes a master latch 404 and a slave latch 406. Each shift register latch 402 contains a data input terminal 408 for receiving functional data and a scan data input 410 for receiving test data. Each shift register latch 402 also includes a data output terminal 414 for outputting functional data and a scan data output 412 for outputting test data. As shown in the figure, the scan data output 412 of a preceding latch 402 directly connects into the scan data input 410 of a succeeding latch 402. This allows data from a preceding latch 402 to be shifted into the succeeding latch 302. Each shift register latch 402 receives a plurality of clock signals (i.e., clock signals $C_1$, $C_2$ and $C_3$) from a system clock (not shown).

During the scan-shift phase of the LBIST, data is shifted from one preceding latch 402 to a succeeding latch 402 by alternating the application of clock signals $C_2$ and $C_3$. For example, scan data enters a master latch 404 from a scan data input terminal 410 upon application of a clock signal on clock line $C_2$. Scan data exits a slave latch 406 through scan data output terminal 412 upon application of a clock signal on clock line $C_3$. Hence, if clock signals on clock lines $C_2$ and $C_3$ are alternated, data will shift from one preceding shift register latch 402 to a succeeding shift register latch 402 in the scan latch 310 of FIG. 3.

During functional operation of the chip, a clock signal is applied to a master latch 404 over clock line $C_1$ to load data from data input terminal 408 into a latch 402. When a clock signal is received by a slave latch 406 over clock line $C_3$, data is outputted onto data output terminal 414.

Note that data output terminals 412 and 414 may be made into one terminal. Further, note that only a single scan latch chain 310 is shown in FIG. 3 (as well as in FIG. 4). However, it should be understood that on a chip, there may generally be hundreds to thousands scan latch chains 310 Therefore, the invention is not restricted to any number of scan latch chains 310.

As mentioned before, although a STUMP may have more than one limiting cone, only one limiting cone may be isolated in any particular STUMP using the LBIST circuit in FIG. 1(a). The present invention allows any number of limiting cones to be isolated in a STUMP.

Figure 1B:
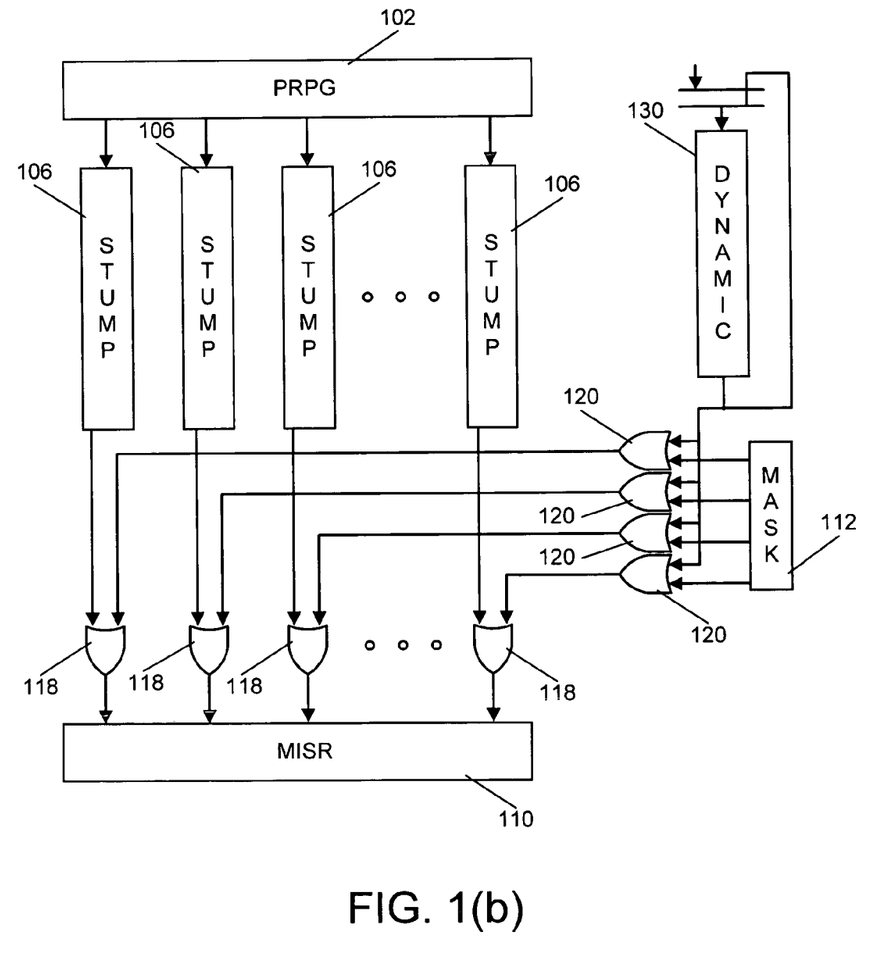
FIG. 1(b) depicts an LBIST circuitry with a loadable scan chain used by the present invention.

In FIG. 1(b), a dynamic mask 130 is added to the circuit in FIG. 1(a). The dynamic mask 130 is a loadable scan chain that may be used to dynamically mask a single latch in a STUMP 106. This additional scan chain should be as long as the longest STUMP 106 in the circuit (and in some cases may be longer by one or two latches). In any case, the length of the loadable scan chain of the dynamic mask 130 should be known since its length will determine the number of shifts that is to be performed during the scan-shift phases of the LBIST.

The output of the loadable scan chain of the dynamic mask 130 feeds back into its input and performs one round shift per LBIST cycle. In addition, the output of the loadable scan chain of the dynamic mask 130 is connected to the mask controller 112 through a plurality of OR-gates 120. The loadable scan chain of the dynamic mask 130 does not contain any cone of influence nor do its latch outputs drive into any functional cones. Thus, the loadable scan chain of the dynamic mask 130 does not receive a functional clock signal. That is no $C_1$ signal (see FIG. 4) is applied to the latches of the loadable scan chain of the dynamic mask 130.

As stated earlier, when a DC data dump of the latches of a STUMP 106 that fails an AC test is compared with an AC data dump, the latch that actually contains the erroneous data; and hence, the limiting cone will be revealed. For example, suppose the scan chain depicted in FIG. 3 is the scan chain that is being tested. Suppose further that data from latch number 9 was different under DC and AC conditions, then the combinational cone of the combinational logic block 316 from which the data from latch number 9 was obtained may be said to be limiting. Since it is now known which latch contains the erroneous data (i.e., latch number 9), then data from that latch may henceforth be masked.

Consequently, the system test engineer may load corresponding latch number 9 from the loadable scan chain of the dynamic mask 130 with a logical "1" while loading all the other latches from the loadable scan chain of the dynamic mask 130 with a logical "0" during the shift-scan of the LBIST. The AC fault detection test may then continue.

During the scan-shift phase of the succeeding LBIST cycle, the logical "1" loaded into latch number 9 of the loadable scan chain of the dynamic mask 130 will be shifted down as the data in latch number 9 of the scan chain under test is shifted down. When the test data from latch number 9 exits the scan chain under test, the logical "1" that was entered into latch number 9 of the dynamic mask 130 will also exit the loadable scan chain of the dynamic mask 130. The logical "1" from the loadable scan chain of the dynamic mask 130 will then be ORed with the data from the scan chain under test. The result will be a logical "1" that will be entered into MISR 110. Knowing that the data from latch number 9 from the scan chain under test is always going to be a logical "1", a proper signature for the unmasked scan chain may be generated. The proper signature may then be compared with the unique signature from the test. If they differ, there is another limiting cone in the scan chain under test; otherwise the scan chain under test does not have another limiting cone.

The procedure disclosed above (i.e., do a dump of the latches under both AC and DC conditions and compare the data together etc.) may then be used to determine any other latch that contains erroneous data. If, in this case, latch number 3 (see FIG. 3) was the second latch to contain erroneous data, a logical "1" may be inserted in corresponding latch number 3 of the loadable scan chain of the dynamic mask 130 and the AC detection test may continue. This procedure may continually be used until the maximum frequency (i.e., the fastest LBIST cycle or functional clock rate) at which the circuit is to be tested is reached. At that point, another STUMP 106 may be AC tested by using the mask controller 112 to mask all but that STUMP 106. Again the dynamic mask 130 may be used to isolate all limiting cones in the STUMP under test.

Note that although OR gates are used with the mask controller 112 (see OR gates 118) and with the dynamic mask 130 (see OR gates 120), the invention is not restricted to only OR gates. Any other combinational logic gate and indeed any circuit may be used so long as a STUMP 106 may be isolated and a result from a latch masked. Thus, the use of the OR gates 118 and 120 is only for illustration purposes.

Figure 1C:
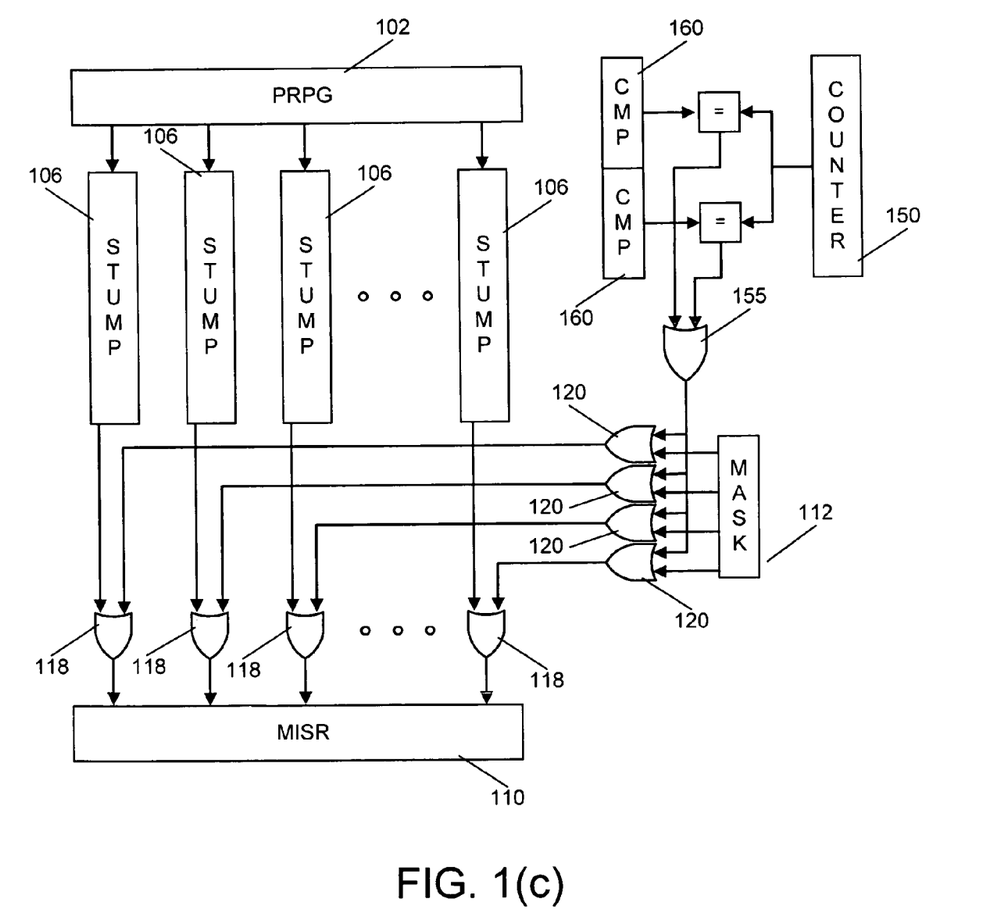
FIG. 1(c) depicts an LBIST circuitry that has the loadable scan chain of FIG. 4(a) replaced by comparators and a counter.

Instead of using a loadable scan chain to dynamically mask the data from a latch that contains erroneous data, counters and comparators may be used. In FIG. 1(c), a counter 150, a couple of comparators 160 and an OR gate 155 are used to replace the loadable scan chain of the dynamic mask 130. Note that although two comparators are shown in the figure, more may be used. Indeed, in a working embodiment of the invention five comparators 160 are used. Thus, the invention is not restricted to any number of comparators. Further, in the working embodiment, a 16-bit counter 150 is used. Again, the invention is not restricted to counters of any particular size.

To continue with the example above, if latch number 9 contains erroneous data after an AC test is performed, the number 9 may be entered into one of the comparators 160. Each time test data is shifted from one latch down to another latch of the STUMP 106 during the scan-shift phase of an LBIST cycle, the counter 150, which will have been initialized to zero, may be incremented. When the counter is incremented to 9, the number in the comparator will match that of the counter and the result of the comparison will be true (i.e., a logical "1" will be at one of the inputs of the OR gate 155.) The output of the OR gate 155 will then be a logical "1" which will be ORed with the bit that is being shifted out of the STUMP 106 (i.e., the bit that was originally in latch number 9). Thus, as in the case of the loadable scan chain, a logical "1" will be entered into MISR 110. If, as the AC test continues, another latch is revealed to contain erroneous data, the latch number may be entered into the other one of the comparators 160 and the test may continue.

Obviously, unlike the circuit in FIG. 1(*b*) which may isolate as many limiting cones as there are latches in a STUMP 106, the circuit in FIG. 1(*c*) may only isolate as many limiting cones as there are comparators in the circuit. Thus, if two comparators 160 are used, only two limiting cones per STUMP may be isolated. If five comparators 160 are used, then five limiting cones may be isolated.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A method of isolating a plurality of limiting logical cones in a chip during a logical built-in self test (LBIST), the chip having a plurality of latches for holding data for a plurality of logical cones, the latches being arranged in a plurality of scan chains, the method comprising the steps of:

running the LBIST on one scan chain to determine if a first latch fails the LBIST;

identifying, if a first latch fails the LBIST, the first latch to isolate a first limiting cone;

masking out the data from the first latch by using a counter, a comparator and a storage device, the counter for keeping a running number of times data is shifted out of the scan chain, the storage device for holding a number representing the location of the first latch in the scan chain and the comparator for comparing the number from the counter to the number in the storage device and using a data of a known value instead of the data from the first latch when the number from the storage device is equal to the number from the counter;

running the LBIST again on the one scan chain to determine if a second latch fails the LBIST; and identifying, if a second latch fails the LBIST, the second latch to isolate a second limiting cone.

2. The method of claim 1 wherein the LBIST is used in an AC fault detection test.

3. The method of claim 1 further including the steps of:

masking out the data from the second latch;

running the LBIST once more on the one scan chain to determine whether a third latch fails the LBIST; and identifying, if a third latch fails the test, the third latch to isolate a third limiting cone.

4. The method of claim 1 wherein the steps are practiced within a client computer system, a server, a notebook computer system or a hand-held computer system.

* * * * *